United States Patent [19]
Seltzer et al.

[11] Patent Number: 5,563,529
[45] Date of Patent: Oct. 8, 1996

[54] HIGH SPEED PRODUCT TERM ALLOCATION STRUCTURE SUPPORTING LOGIC ITERATION AFTER COMMITTING DEVICE PIN LOCATIONS

[75] Inventors: Jeffrey H. Seltzer, Los Gatos; Jesse H. Jenkins, IV, Danville; Sholeh Diba, Los Gatos, all of Calif.

[73] Assignee: Xilinx, Inc., San Jose, Calif.

[21] Appl. No.: 452,448

[22] Filed: May 26, 1995

[51] Int. Cl.$^6$ .................................................. H03K 19/00
[52] U.S. Cl. ................................................................ 326/39
[58] Field of Search ........................................ 326/38, 39

[56] References Cited

U.S. PATENT DOCUMENTS

| | | | |
|---|---|---|---|
| 4,758,746 | 7/1988 | Birkner et al. | 307/465 |
| 4,912,345 | 3/1990 | Steele et al. | 307/465 |
| 4,933,577 | 6/1990 | Wong et al. | 307/465 |
| 5,027,011 | 6/1991 | Steele | 307/465 |
| 5,027,315 | 6/1991 | Agrawal et al. | 364/900 |
| 5,121,006 | 6/1992 | Pedersen | 307/465 |
| 5,136,188 | 8/1992 | Ha et al. | 307/465 |
| 5,260,611 | 11/1993 | Cliff et al. | 307/465 |
| 5,309,046 | 5/1994 | Steele | 326/39 |
| 5,350,954 | 9/1994 | Patel | 326/39 |
| 5,357,153 | 10/1994 | Chiang et al. | 326/39 |

*Primary Examiner*—Edward P. Westin
*Assistant Examiner*—Richard Roseen
*Attorney, Agent, or Firm*—E. Eric Hoffman; Jeanette S. Harms

[57] ABSTRACT

A macrocell for flexibly routing product terms from an AND array to output terminals of a programmable logic device. The macrocell allows a variable number of product terms to be retained by the macrocell, and a variable number of product terms to be exported to a second macrocell. The direction in which the product terms are exported can be controlled. The macrocell further allows a variable number of product terms to be received from a third macrocell and routed either to the output terminal of the first macrocell or to the second macrocell in combination with those product terms exported from the first macrocell. Methods for routing product terms using macrocells within a programmable logic device are also provided.

30 Claims, 10 Drawing Sheets

HIGH SPEED PRODUCT TERM ALLOCATION STRUCTURE SUPPORTING LOGIC ITERATION AFTER COMMITTING DEVICE PIN LOCATIONS

BACKGROUND OF THE INVENTION

1. Field of the Invention

This invention relates to a structure and a method of implementing custom logic functions in an integrated circuit logic device and more specifically to the reallocation of product terms after pins of the device have been committed.

2. Description of the Prior Art

In response to the increasing need for flexibility and speed in integrated circuit (IC) design, a class of IC's known as programmable logic devices (PLDs) was developed. PLDs enable the designer to custom program arbitrary logical functions in an IC chip, according relative ease and flexibility in testing prototypes and making design changes.

FIG. 1 illustrates one PLD architecture which includes an array of function blocks 1, 2, 3, 4 interconnected via an interconnect matrix (UIM) 5. For simplicity, only one function block is shown in detail. The input lines 6 into function block 1 are programmably combined into a number of AND gates 7 in an AND array 8. The output lines 9 from AND array 8 are called product terms (or bit lines). Product terms 9 of AND gates 7 are provided to one of a series of macrocells (MCs) 10 in each logic block.

The architecture of a typical macrocell 10 is shown in FIG. 2. Macrocell 10 configures the outputs of AND array 8 of FIG. 1 and may perform additional logic on the output signals of AND array 8. Macrocell 10 contains an OR gate 11 into which product terms are gated, and a register (flip flop) 12 for storing the output signal of OR gate 11. The signals on output line 13 of OR gate 11 and output lines 13a and 13b of register 12 are programmably routed by setting the multiplexers (MUXs) 14, 15 and 16 with configuration bits on their control terminals, each specifying the output state of the respective MUX.

Macrocell 10 advantageously provides a relatively large number (eight) of product terms 11.1 per macrocell. However, a fixed product term count is not flexible enough to handle the product term count variability that arises. Specifically, user product term requirements for a logic function typically vary widely, anywhere from one to sixteen product terms or more, depending on the complexity of the logic function. In fact, single product term functions are quite common. For logic functions requiring less than eight product terms in macrocell 10, the unused product terms are wasted. For functions requiring more than eight product terms, the function must be split up into two or more subfunctions, each of which can be implemented with the available eight product terms of a macrocell. The results of the subfunction operations must make additional passes through the AND array to be recombined in other macrocells, thus incurring a significant time delay in the execution of complex logic functions.

To address the need for a flexible macrocell architecture, more recent PLDs feature macrocells with the ability to direct their OR gate output signals into adjacent macrocell OR gates, a feature known as cascading. Cascading enables product terms associated with more than one macrocell to be logically combined in a single macrocell. This process is known as product term expansion.

Product term expansion is particularly useful during the design of complex integrated circuitry. A serious problem introduced by PLD architectures is that, after device output pin locations are committed (as on a printed circuit board), further alterations of the application logic implemented within the PLD often cannot be accomplished without relocating some of the output pins. The problem of relocation is more prevalent when logic functions have already been formed using product term cascading. Relocation of the output pins results in design delay and expense.

Certain prior art devices provide for the reallocation of product terms by allowing a first cluster of macrocell product terms (e.g., 3 or 4) to be shifted to a first neighboring macrocell and allowing a second cluster of macrocell product terms to be shifted to a second neighboring macrocell. Either all or none of the product terms in the cluster are reallocated. Moreover, each cluster cannot be reallocated beyond its associated neighboring macrocell.

Other prior art devices provide for the reallocation of product terms by providing a path between a series of macrocells. Fixed blocks of four product terms are propagated in a predetermined direction along this path to any one of the macrocells. Yet other devices incorporate macrocells which allow product term expansion without additional passes through macrocell logic. Such macrocells work by "stealing" all the product terms of one or both of its neighboring macrocells, for a total of up to 16 product terms. These macrocells can only "steal" product terms from its immediate neighbors, thereby limiting the flexibility of the macrocells. Moreover, these macrocells are also limited to 16 product terms, and the register within a macrocell whose product terms are stolen is thereby rendered useless.

FIG. 3 shows a macrocell 17 disclosed in Pedersen U.S. Pat. No. 5,121,006. In macrocell 17, cascading is accomplished by setting the configuration bit of MUX 18 to logic 1, thereby directing the signal on output line 19 of OR gate 20 into OR gate 21 of an adjacent macrocell 22. By cascading a series of macrocells in this way, a selectable number of product terms are gated together. For example, OR gate 33 from adjacent macrocell 34 is shown cascaded into OR gate 20 of macrocell 17. The cascading described in Pedersen is uni-directional.

If not all of the product terms in macrocell 17 are provided to adjacent macrocell 22, the unused product terms can be routed to the input of exclusive OR gate 36 or to the secondary inputs of register 32. This routing is perforated by means of switches 23, 24, 25, 26, 27 and the MUXs 28, 29, 30, 31. The circuit of Pedersen undesirably increases complexity and thus compromises speed. Additionally, macrocell 17 does not provide means for performing an OR operation on the unused product terms.

Other patents which discuss the reallocation of product terms include: U.S. Pat. Nos. 4,758,746 (Birkner et al.); 4,912,345 (Steele et al.); 4,933,577 (Wong et al.); 5,027,011 (Steele); 5,027,315 (Agrawal et al.); 5,136,188 (Ha et al.); 5,260,611 (Cliff et al.) and 5,309,046 (Steele).

Therefore, a need arises for a high speed product term allocation structure that supports the flexible reallocation of product terms among macrocells, even after the device pins have been committed. In particular, a need arises for a product term allocation structure which allows (1) routing of product terms in a bi-directional manner between macrocells, (2) routing of product terms through a plurality of macrocells, (3) routing a variable, selectable number of product terms without a loss of capacity in the macrocell from which the product term is routed, and (4) importing product terms to perform a large function within a local macrocell, while simultaneously exporting product terms from the local macrocell to another macrocell, to maintain the committed pinout during the design phase. None of the above-mentioned documents, nor any combination of the above-mentioned documents, disclose a device which provides these desired advantages.

SUMMARY OF THE INVENTION

A macrocell in accordance with one embodiment of the present invention includes a plurality of product term lines which receive a corresponding plurality of product terms from an AND array. Each product term line is connected to a product term distribution circuit which is independently programmed to a first or second state. When a product term distribution circuit is programmed in the first state, the product term received by the product term distribution circuit is routed to the output terminal of the macrocell. When a product term distribution circuit is programmed in the second state, the product term received by the product term distribution circuit is routed to another macrocell. Such a macrocell advantageously allows a variable number of product terms to be retained by the macrocell, and a variable number of product terms to be exported by the macrocell.

In one embodiment, the macrocell includes a programmable cascade control circuit which is coupled to the product term distribution circuit. When programmed in a first state, the cascade control circuit routes received product terms to a second macrocell. When programmed in a second state, the cascade control circuit routes received product terms to a third macrocell. In this manner, the cascade control circuit controls the direction in which the product terms are routed.

In an alternative embodiment, the product term distribution circuits which are programmed in the second state route their associated product terms to a second macrocell. Additionally, the macrocell includes a programmable cascade control circuit which has an input terminal connected to a third macrocell such that the cascade control circuit can receive product terms from the third macrocell. Thus, the macrocell can transmit local product terms to a second macrocell while simultaneously receiving product terms from a third macrocell. This provides flexibility in reallocating product terms after the pinout of the device has been selected.

A macrocell in accordance with another embodiment of the invention includes a first cascade control circuit and a second cascade control circuit. The first cascade control circuit has an input terminal connected to a second macrocell such that the first cascade control circuit receives product terms from the second macrocell. The first cascade control circuit is programmed to route these received product terms to the second cascade control circuit. The second cascade control circuit is programmed to route the product terms received from the second macrocell to a third macrocell. Thus, the product terms received from the second macrocell are transmitted to the third macrocell through an intermediate macrocell. The product terms which the intermediate macrocell receives from the AND array are combined with the product terms received from the second macrocell and transmitted to the third macrocell. In this manner, the present invention advantageously allows a large number of product terms to be transmitted to the third macrocell.

In accordance with another embodiment, the present invention includes a method of routing product terms from a memory array to output terminals in a programmable logic device. This method includes the steps of (1) providing a plurality of first product terms to a first macrocell, (2) selecting a first group of the first product terms, the first group having a variable number of product terms, (3) transmitting the first group of the first product terms to an output terminal corresponding to the first macrocell, (4) selecting a second group of the first product terms, the second group having a variable number of product terms, and (5) transmitting the second group of the first product terms to a second macrocell. In one variation of this method, the second macrocell is adjacent to the first macrocell. In another variation, the second group of the first product terms are transmitted through one or more intermediate macrocells. In another embodiment, this method includes the step of either selecting the second macrocell from a group consisting of the second macrocell and a third macrocell, or importing one or more product terms from a third macrocell to the output terminal.

In accordance with yet another embodiment, the present invention includes a method of routing product terms among a plurality of macrocells within a programmable logic device. This method includes the steps of: (1) routing a product term from a memory array to an output terminal of a first macrocell, (2) receiving the product term at an input terminal of a second macrocell, (3) routing the product term through the second macrocell to an output terminal of the second macrocell, (4) receiving the product term at an input terminal of a third macrocell, and (5) routing the product term through the third macrocell to an output terminal of the third macrocell.

The present invention will be more fully understood in light of the following detailed description taken together with the drawings.

DETAILED DESCRIPTION OF THE DRAWINGS

Figure 1:
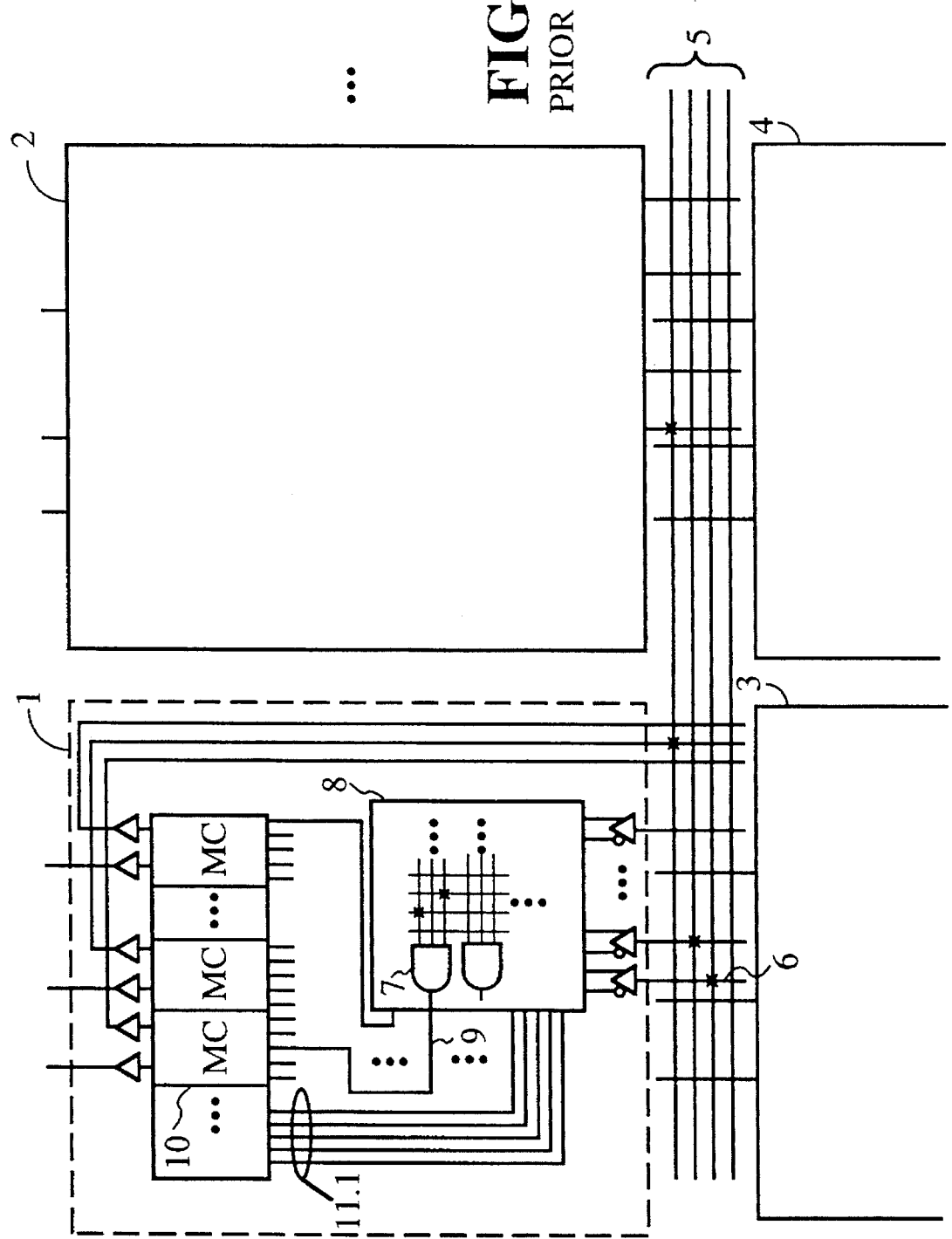
FIG. 1 is a block diagram of prior art PLD architecture.
Figure 2:
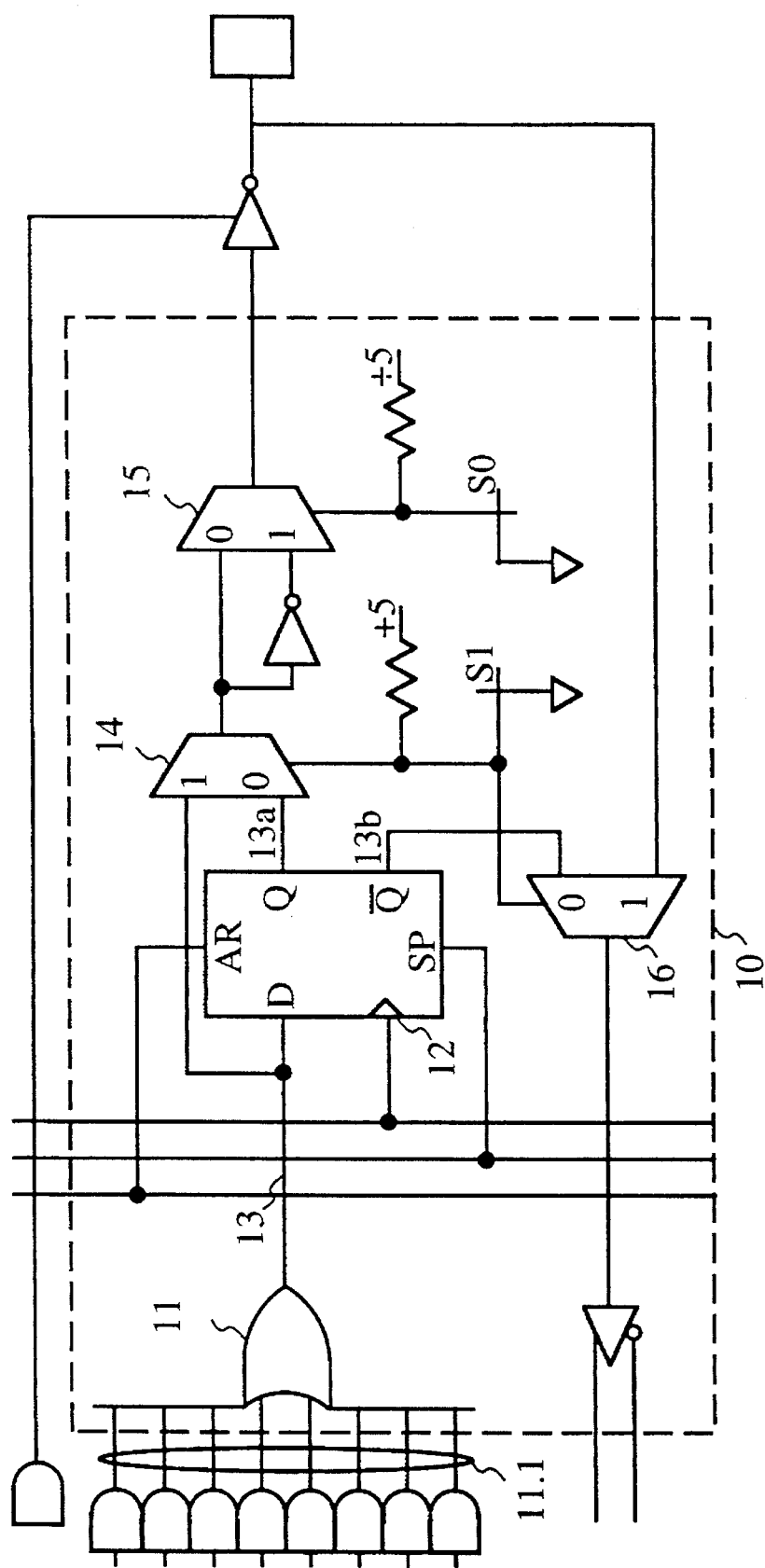
FIG. 2 is a schematic diagram of a prior art macrocell circuit.
Figure 3:
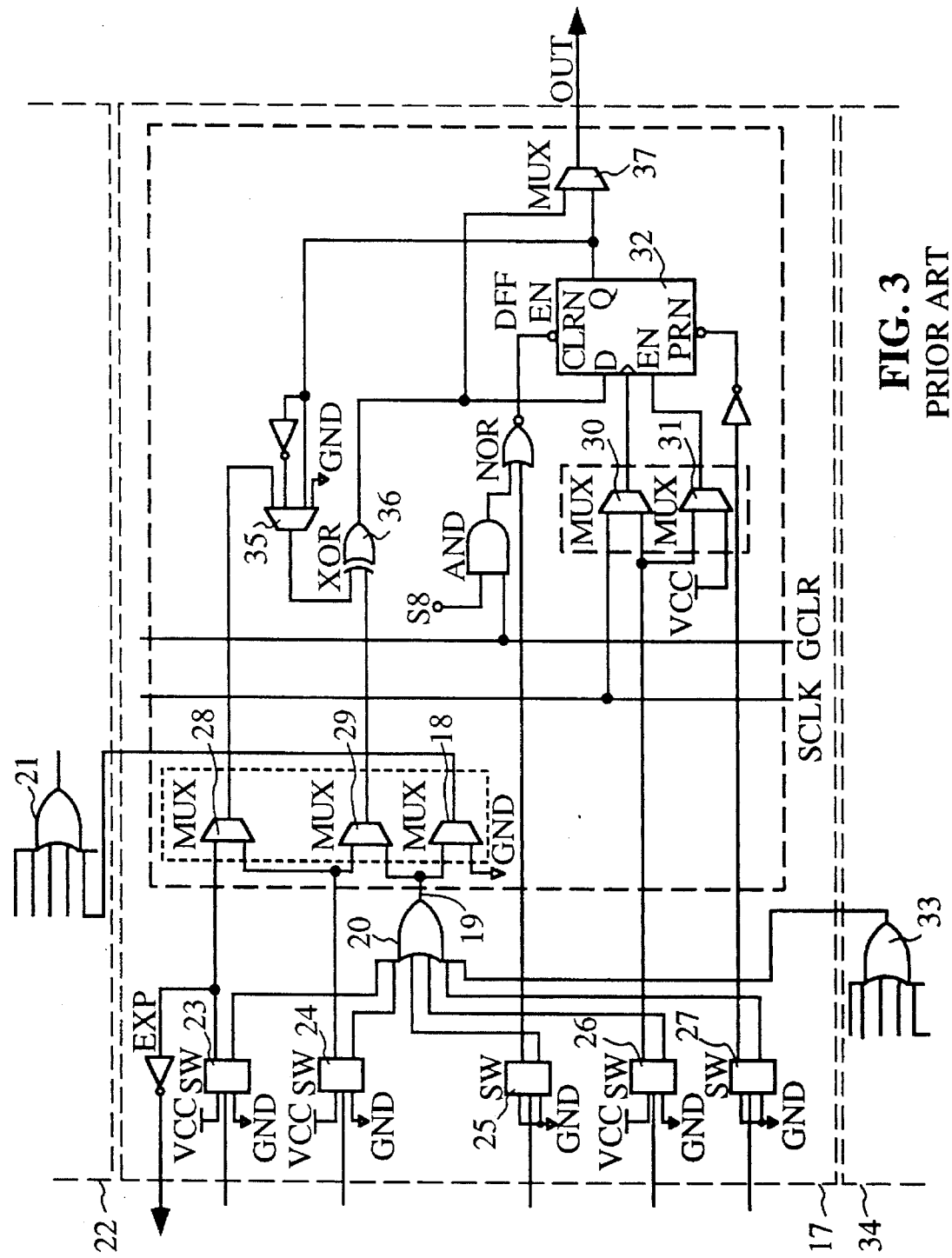
FIG. 3 is a schematic diagram of another prior art macrocell circuit.
Figure 4:
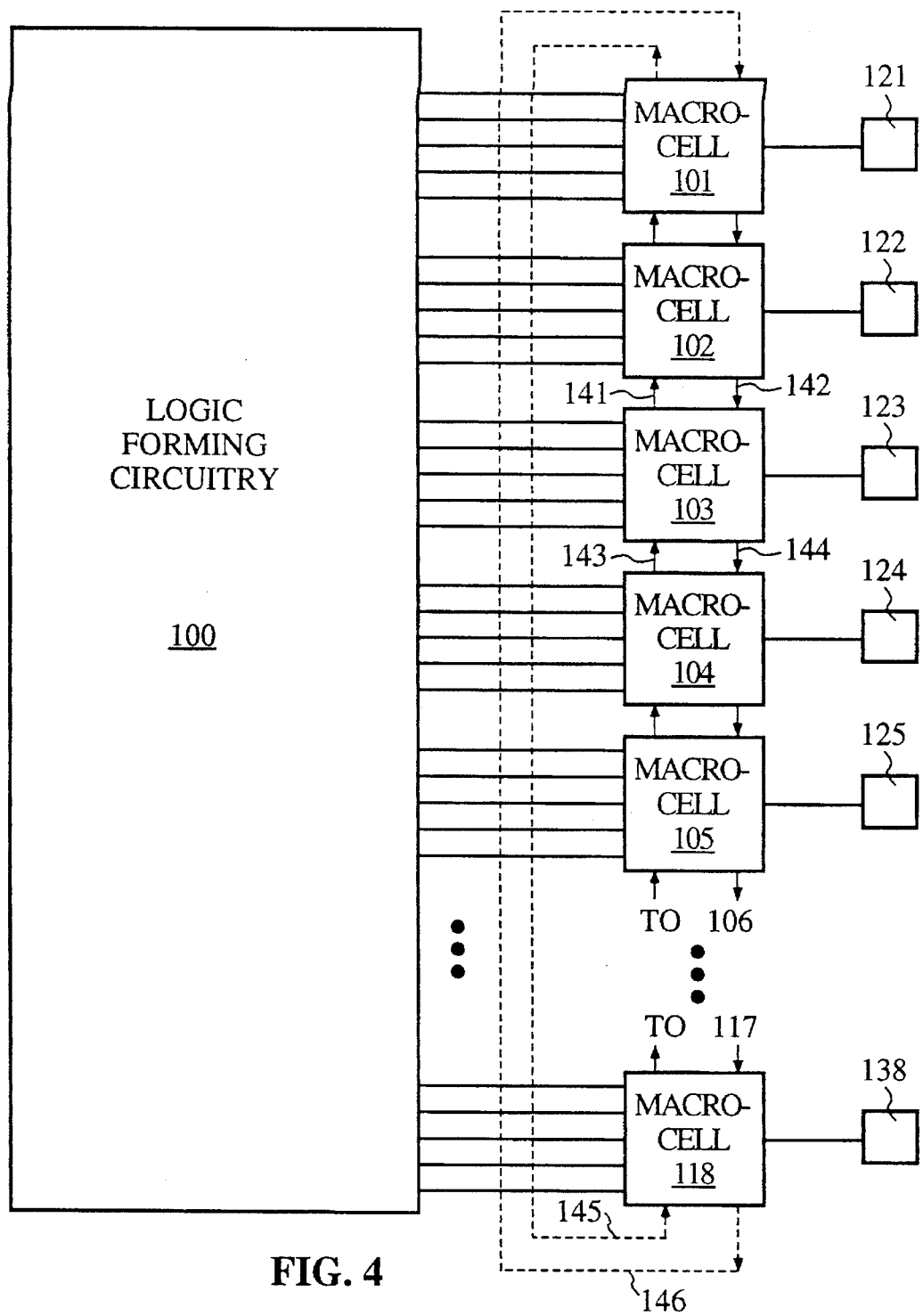
FIG. 4 is a schematic diagram of an AND array, macrocells and output terminals in accordance with one embodiment of the present invention.

FIG. 4 is a schematic diagram of logic forming circuitry 100 (which can be, for example, an AND array or a look-up table), macrocells 101–118 and output terminals 121–138 in accordance with one embodiment of the present invention. In this embodiment, logic forming circuitry 100 (an AND array) has 72 columns (not shown) and 90 rows (i.e., bit lines). The 90 bit lines are arranged in 18 groups, wherein each group includes 5 bit lines. Each group of 5 bit lines is provided to a corresponding one of macrocells 101–118.

Each macrocell 101–118 is connected to a corresponding output terminal 121–138. Each of macrocells 102–117 is also connected to its two adjacent macrocells. For example, macrocell 103 is connected to macrocell 102 by connector lines 141 and 142 and to macrocell 104 by connector lines 143 and 144. In the embodiment illustrated, macrocells 101 and 118 are connected to macrocells 102 and 117 (not shown), respectively, thereby forming a linear chain between macrocells 101 and 118. In an alternate embodiment, illustrated by dashed lines 145 and 146, macrocells 101 and 118 are also connected, thereby forming a ring connection between macrocells 101–118. As described in more detail below, the connections between macrocells 101–118 allow product terms to be transmitted between these macrocells.

Macrocells 101–118 are described below using the terms "previous macrocell" and "subsequent macrocell." A previous macrocell is defined as any macrocell which is positioned "above" a particular macrocell in FIG. 4. Thus, macrocells 101 and 102 are previous macrocells with respect to macrocell 103. A subsequent macrocell is defined as any macrocell which is positioned "below" a particular macrocell in FIG. 4. Thus, macrocells 104–118 are subsequent macrocells with respect to macrocell 103.

Figure 5:
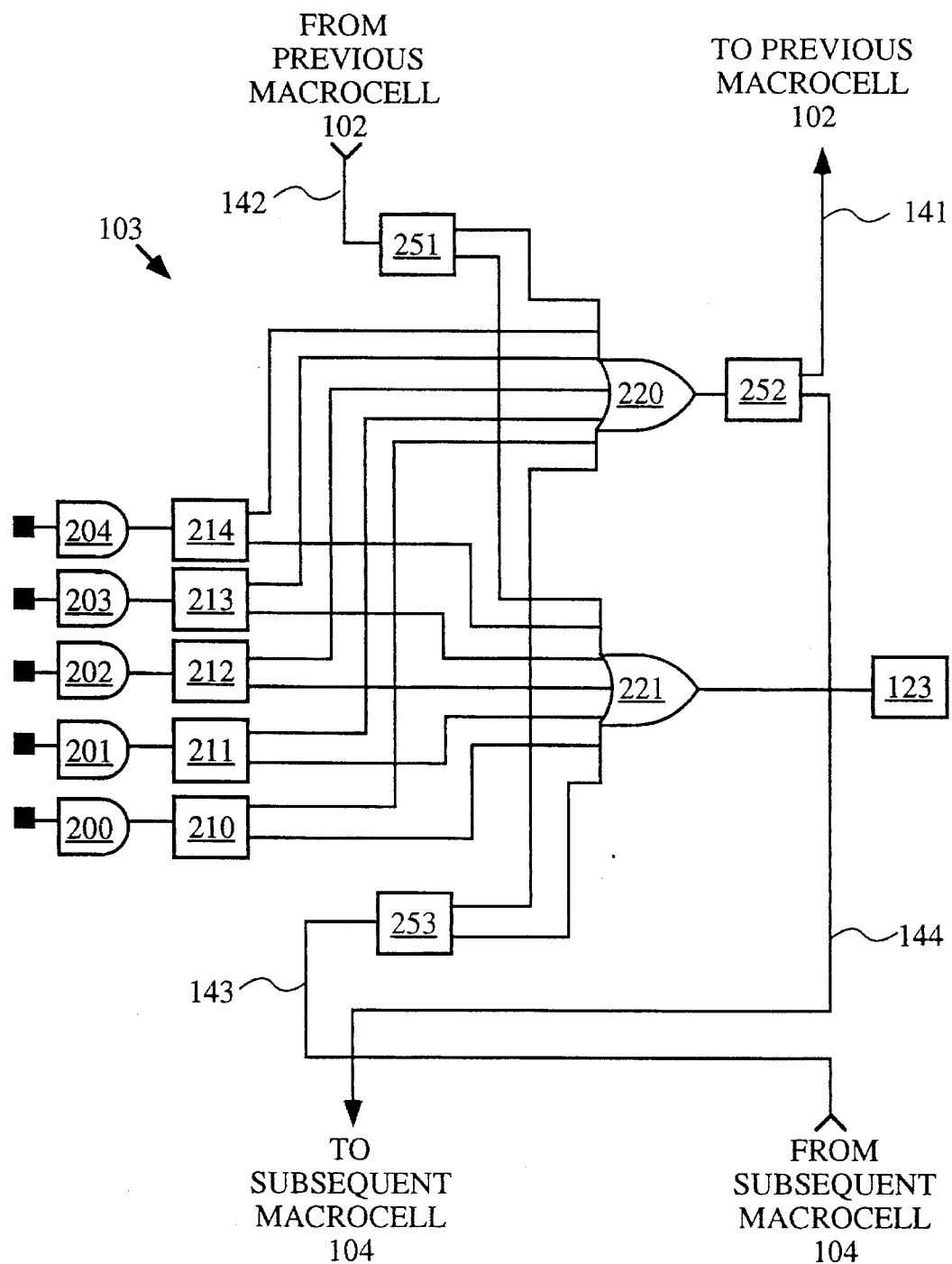
FIG. 5 is a schematic diagram illustrating one embodiment of the macrocell of FIG. 4.

FIG. 5 is a schematic diagram illustrating macrocell 103 in accordance with one embodiment of the invention. In this embodiment, macrocells 101–102 and 104–118 are identical to macrocell 103. Macrocell 103 includes AND gates 200–204, product term distribution circuits 210–214, 7-input OR gates 220 and 221, and cascade control circuits 251–253.

Product terms PT0, PT1, PT2, PT3 and PT4 are provided from logic forming circuitry 100 to sense amplifier circuits which are represented as single input AND gates 200, 201, 202, 203 and 204, respectively. As a result, product terms PT0–PT4 are routed to product term distribution circuits 210–214, respectively. Although the present invention is described in connection with product terms, it is understood that other logic signals derived from logic forming circuitry can be used in place of product terms.

Figure 6:
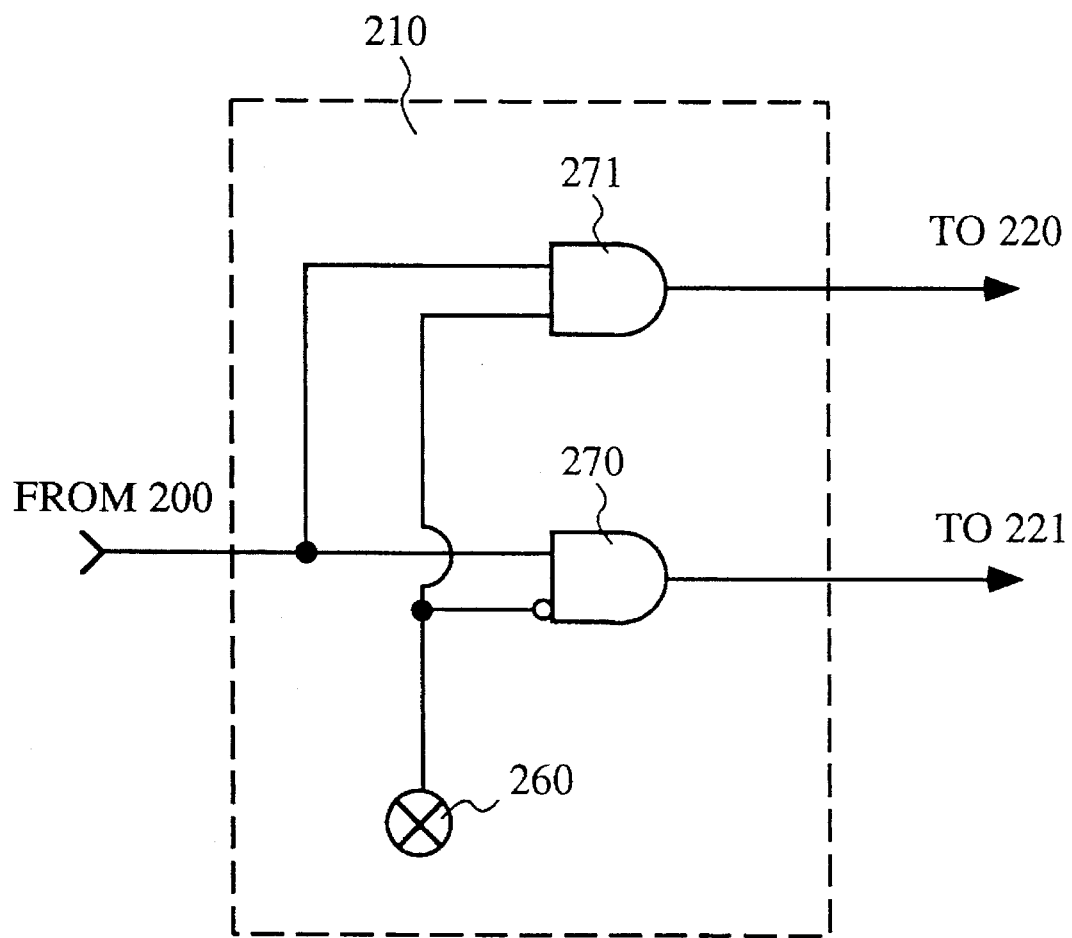
FIG. 6 is a schematic diagram of a product term distribution circuit of the macrocell of FIG. 5.

FIG. 6 is a schematic diagram illustrating product term distribution circuit 210. Product term distribution circuits 211–214 are substantially identical to product term distribution circuit 210. Product term distribution circuit 210 includes AND gates 270–271 and configurable bit latch 260. The output terminal of AND gate 200 is connected to an input terminal of each of AND gates 270 and 271, thereby providing product term PT0 to input terminals of AND gates 270 and 271. The other input terminal of AND gate 271 is connected directly to the output terminal of configurable bit latch 260. The other input terminal of AND gate 270 (which inverts the signal received) is also connected to output terminal of configurable bit latch 260. Configurable bit latch 260 is a conventional element which is programmed during initialization of the PLD to provide a logic "0" or a logic "1" value at its output terminal. The state of configurable bit latch 260 determines whether PT0 is routed to the output terminal of AND gate 270 (i.e., to export OR gate 220) or to the output terminal of AND gate 271 (i.e., to local OR gate 221). Product term distribution circuits 211–214 operate in a manner similar to product term distribution circuit 210. As a result, each of product terms PT0–PT4 is selectively routed to either export OR gate 220 or local OR gate 221.

Output terminals of product term distribution circuits 210–214 are connected to input terminals of export OR gate 220. The two additional input terminals of export OR gate 220 are connected to output terminals of cascade control circuits 251 and 253. As described in more detail below, cascade control circuit 251 receives product terms from one or more of previous macrocells 101–102 and cascade control circuit 253 receives product terms from one or more of subsequent macrocells 104–118. The output terminal of export OR gate 220 is connected to cascade control circuit 252. As described in more detail below, cascade control circuit 252 is programmed to route the product terms applied to the input terminals of export OR gate 220 to one of previous macrocells 101–102 or to one of subsequent macrocells 104–118.

Output terminals of product term distribution circuits 210–214 are also connected to input terminals of 7-input local OR gate 221. The other two input terminals of local OR gate 221 are connected to output terminals of cascade control circuits 251 and 253. As described in more detail below, cascade control circuits 251 and 253 are connected to be able to receive product terms from previous macrocells 101–102 and subsequent macrocells 104–118, respectively. The output terminal of local OR gate 221 is connected to output terminal 123.

Figure 7A:
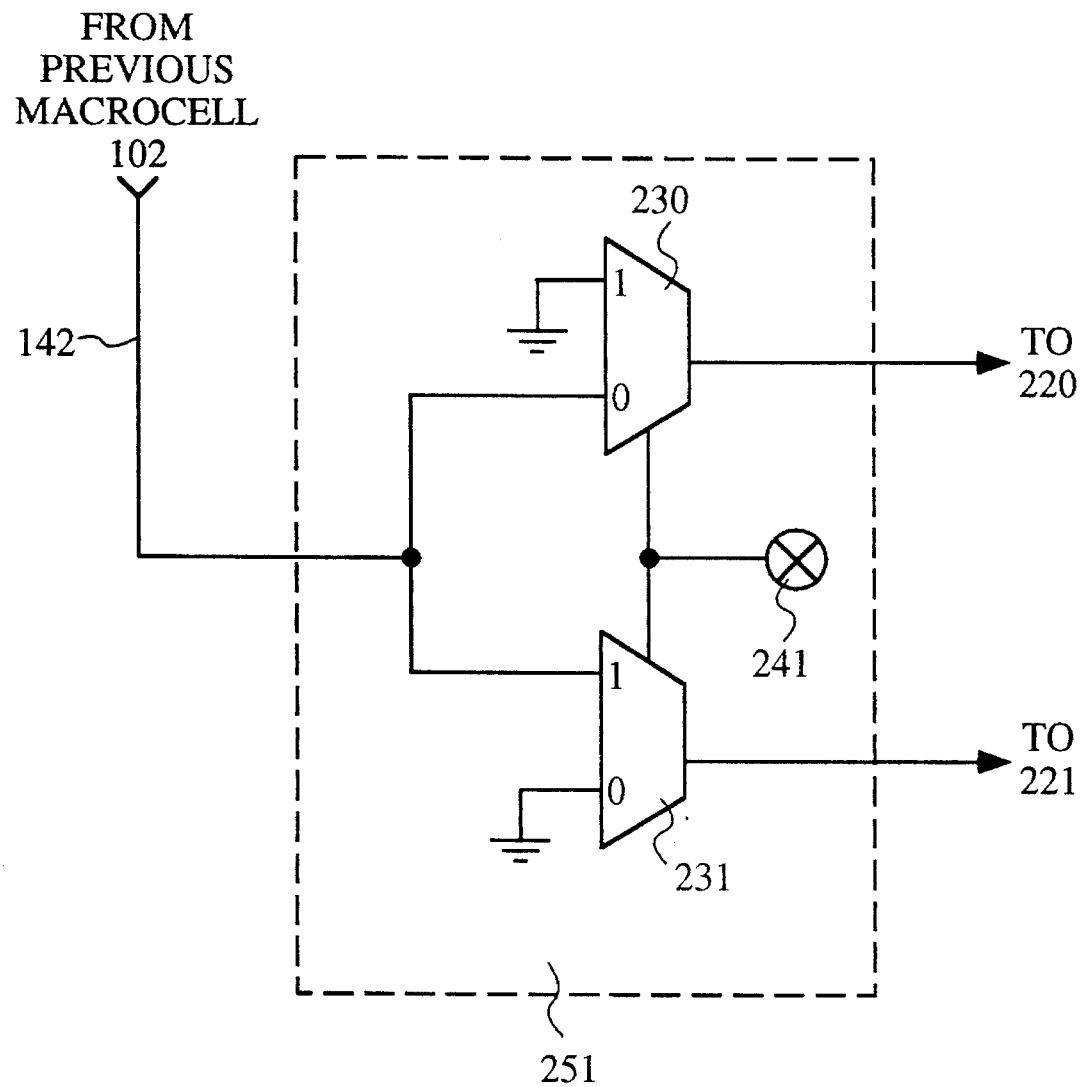
FIGS. 7a–7c are schematic diagrams of cascade control circuits of the macrocell of FIG. 5.

FIG. 7a is a schematic diagram of cascade control circuit 251. Product terms from previous macrocells 101–102 are provided to cascade control circuit 251 of macrocell 103 on connection line 142. Cascade control circuit 251 includes 2-to-1 multiplexers 230 and 231 and configurable bit latch 241. Connection line 142 is connected to the "0" input terminal of multiplexer 230 and to the "1" input terminal of multiplexer 231. The "1" input terminal of multiplexer 230 and the "0" input terminal of multiplexer 231 are each connected to ground, thereby providing a logic low value to these terminals. Configurable bit latch 241 is connected to the control terminals of multiplexers 230 and 231. Configurable bit latch 241 is programmed during initialization of the PLD to provide either a logic high or a logic low signal to the control terminals of multiplexers 230 and 231. When the configurable bit latch 241 is programmed to provide a logic low signal to multiplexers 230 and 231, the product terms received from previous macrocells 101–102 are provided to export OR gate 220 (local OR gate 221 receives a logic low signal). When the configurable bit latch 241 is programmed to provide a logic high signal to multiplexers 230 and 231, the product terms received from previous macrocells 101–102 are provided to local OR gate 221 (export OR gate 220 receives a logic low signal).

Figure 7B:
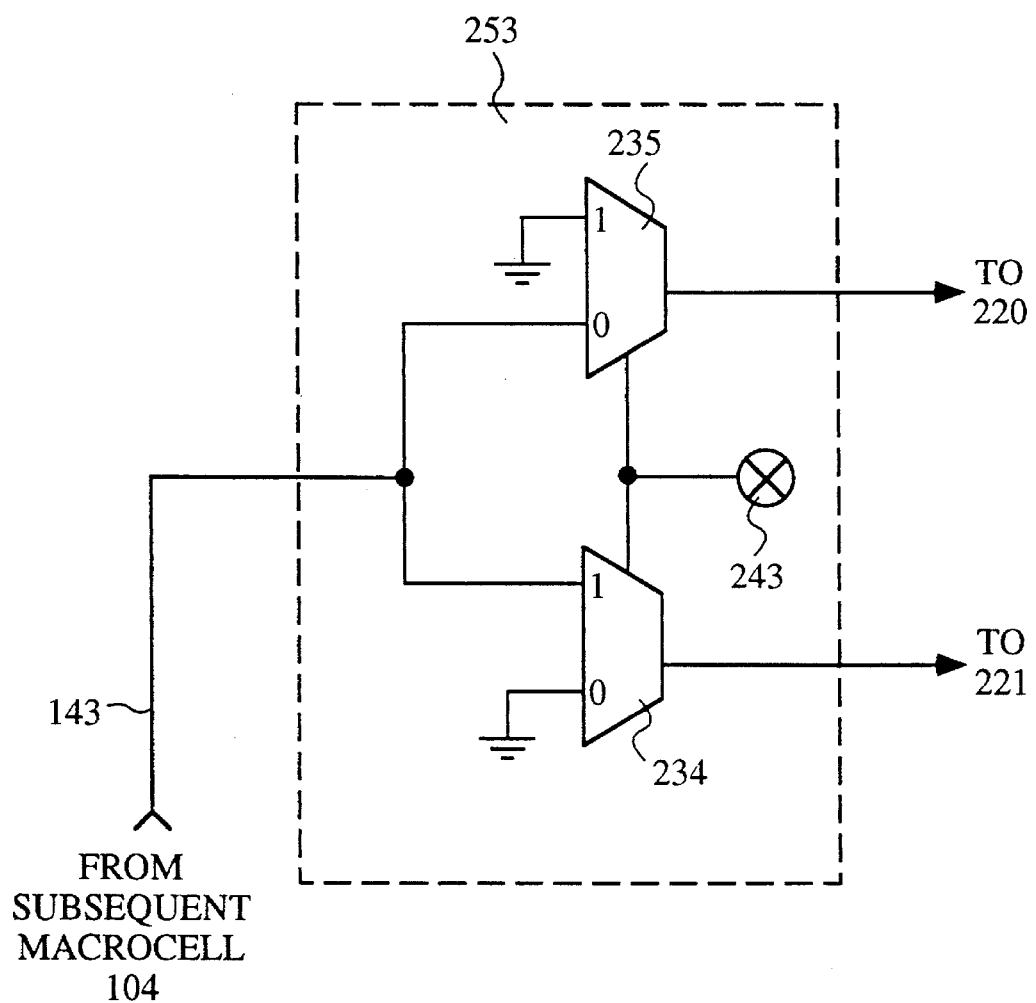

Similarly, product terms from subsequent macrocells 104–118 are provided to cascade control circuit 253 of macrocell 103 on connection line 143. FIG. 7b is a schematic diagram of cascade control circuit 253. Cascade control circuit 253 includes 2-to-1 multiplexers 234 and 235 and configurable bit latch 243. Connection line 143 is connected to the "0" input terminal of multiplexer 235 and to the "1" input terminal of multiplexer 234. The "1" input terminal of multiplexer 235 and the "0" input terminal of multiplexer 234 are connected to ground, thereby providing a logic low signal to these terminals. Configurable bit latch 243 is connected to the control terminals of multiplexers 234 and 235. Configurable bit latch 243 is programmed during initialization of the PLD to provide a logic high or a logic low signal to the control terminals of multiplexers 234 and 235. When the configurable bit latch 243 is programmed to provide a logic low signal to multiplexers 234 and 235, the product terms received from subsequent macrocells 104–118 are provided to export OR gate 220 (local OR gate 221 receives a logic low signal). When configurable bit latch 243 is programmed to provide a logic high signal to multiplexers 234 and 235, the product terms received from subsequent macrocells 104–118 are provided to local OR gate 221 (export OR gate 220 receives a logic low signal).

Figure 7C:
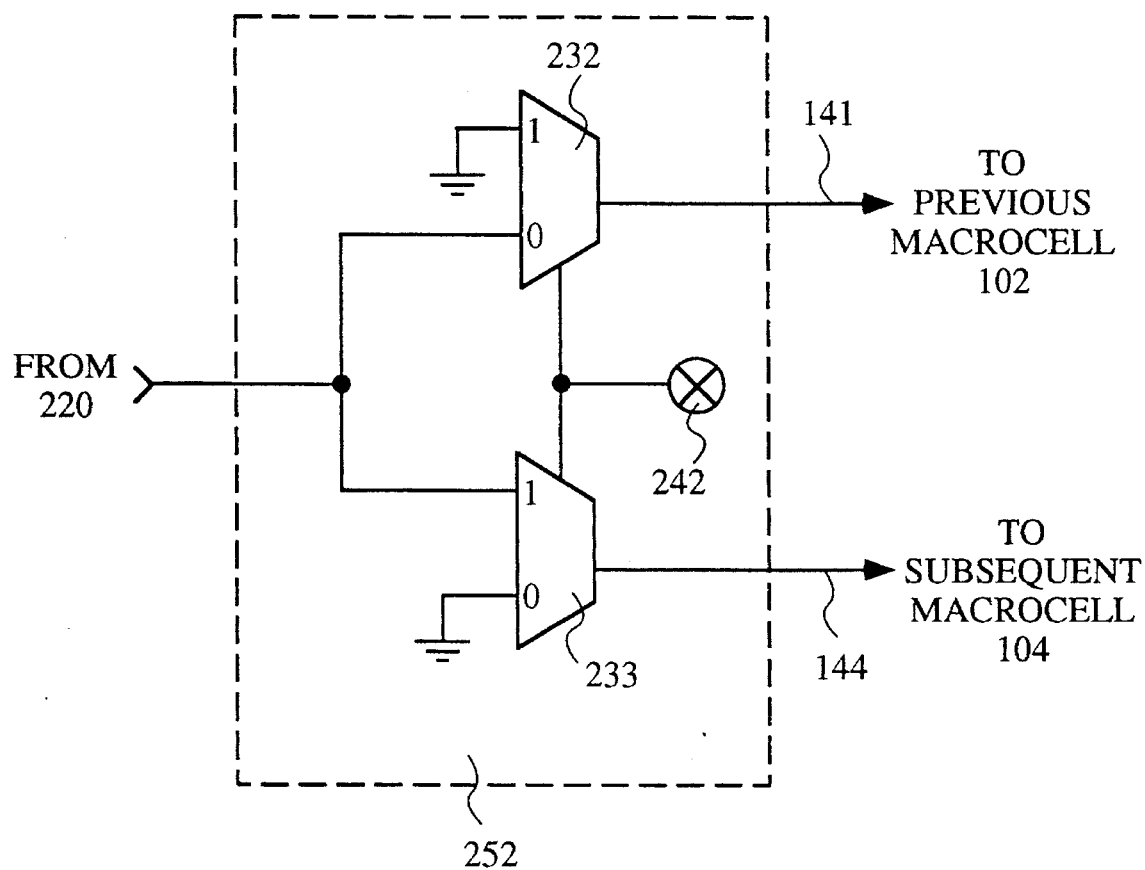

Product terms passed to the output terminal of export OR gate 220 are routed to one of previous macrocells 101–102 or to one of subsequent macrocells 104–118 through cascade control circuit 252. FIG. 7c is a schematic diagram of cascade control circuit 252. Cascade control circuit 252 includes 2-to-1 multiplexers 232 and 233 and configurable bit latch 242. The output terminal of export OR gate 220 is connected to the "0" input terminal of multiplexer 232 and to the "1" input terminal of multiplexer 233. The "1" input terminal of multiplexer 232 and the "0" input terminal of multiplexer 233 are connected to ground, thereby providing a logic low signal to these input terminals. The control terminals of multiplexers 232 and 233 are connected to configurable bit latch 242. If configurable bit latch 242 is programmed to provide a logic low signal to the control terminals of multiplexers 232 and 233, the product terms provided at the output terminal of export OR gate 220 are routed through multiplexer 232 to one of previous macrocells 101–102 on connector line 141 and a logic low signal is transmitted to subsequent macrocell 104 on connector line 144.

If configurable bit latch 242 is programmed to provide a logic high signal to the control terminals of multiplexers 232 and 233, the product terms provided at the output terminal of export OR gate 220 are routed through multiplexer 233 to one of subsequent macrocells 104–118 on connector line 144 and a logic low signal is transmitted to previous macrocell 102 on connector line 141.

Table 1 below summarizes the operation of macrocells 102–104. The reference numbers illustrated in parentheses define the operation of macrocell 103 if any of product terms PT0–PT4 are routed to export OR gate 220. If none of product terms PT0–PT4 are routed to export OR gate 220, the reference numbers shown in parentheses are ignored. For example, in the second row of Table 1, product terms are imported to macrocell 103 from macrocell 104 and exported from macrocell 103 to macrocell 102. If any of product terms PT0–PT4 are routed to export OR gate 220, these product terms will also be exported from macrocell 103 to macrocell 102. If none of product terms PT0–PT4 are routed to export OR gate 220, none of product terms PT0–PT4 are exported from macrocell 103 to macrocell 102.

TABLE 1

| Status of 241 | Status of 242 | Status of 243 | Local OR gate 221 of MC 103 Imports PTs From Macrocell | PTs Exported From Macrocell | PTs Exported To Macrocell |
| --- | --- | --- | --- | --- | --- |
| 0 | 0 | 0 | — | 104(103) | 102 |
| 0 | 0 | 1 | 104 | (103) | (102) |
| 0 | 1 | 0 | — | 102(103) | 104 |
| 0 | 1 | 1 | 104 | 102(103) | 104 |
| 1 | 0 | 0 | 102 | 104(103) | 102 |
| 1 | 0 | 1 | 102 + 104 | (103) | (102) |
| 1 | 1 | 0 | 102 | (103) | (104) |
| 1 | 1 | 1 | 102 + 104 | (103) | (104) |

Row 1 of Table 1 describes a "pass-through backward" configuration in which product terms from subsequent macrocell 104 are routed to previous macrocell 102 through macrocell 103. Row 3 of Table 1 describes a "pass-through forward" configuration in which product terms from previous macrocell 102 are routed to subsequent macrocell 104 through macrocell 103. Macrocell 103 does not import any product terms from macrocells 102 or 104 in the "pass-through backward" or "pass through forward" configurations. The "pass through backward" and "pass through forward" configurations are useful to allow product terms to be passed through macrocell 103 without using these passed through product terms to form the output function of macrocell 103. If the output function of macrocell 103 requires less than all of its five local product terms PT0–PT4, then any of the remaining local product terms can be combined with the passed through product terms (using export OR gate 220) and routed to one of the previous or subsequent macrocells.

Row 2 of Table 1 describes a "normal import backward" configuration in which one or more product terms from subsequent macrocell 104 are routed for local use within macrocell 103, while one or more local product terms PT0–PT4 are routed to previous macrocell 102. Similarly, Row 7 of Table 1 describes a "normal import forward" configuration in which one or more product terms from previous macrocell 102 are routed for local use within macrocell 103, while one or more local product terms PT0–PT4 are routed to subsequent macrocell 104.

The "normal import backward" and "normal import forward" configurations are useful to reallocate product terms after a pinout has been committed. For example, the "normal import backward" configuration allows a number of unused product terms of subsequent macrocell 104 to be routed for use within macrocell 103, thereby freeing a corresponding number of product terms of macrocell 103 to be routed for use within previous macrocell 102.

Row 4 of Table 1 describes an "alternative import" configuration in which macrocell 103 receives additional product terms from subsequent macrocell 104. The product terms surrendered by macrocell 104 are replaced by routing product terms from previous macrocell 102 to subsequent macrocell 104. Similarly, Row 5 of Table 1 describes another "alternative import" configuration in which macrocell 103 receives additional product terms from previous macrocell 102. The product terms surrendered by macrocell 102 are replaced by routing product terms from macrocell 104 to macrocell 102. These "alternative import" configurations provide extra flexibility in the reallocation of product terms.

Rows 6 and 8 of Table 1 describe "double import" configurations, in which macrocell 103 receives product terms from both previous macrocell 102 and subsequent macrocell 104. Macrocell 103 is capable of routing one or more of local product terms PT0–PT4 to subsequent macrocell 104 (Row 8 configuration) or to previous macrocell 102 (Row 6 configuration). These "double import" configurations allow macrocell 103 to import a large number of product terms.

Macrocells 101–118 advantageously allow the routing of a variable, selectable number of product terms. Thus, any group of the five product terms PT0–PT4 are selectively routed to: (1) a previous macrocell (e.g., macrocell 101 or 102), (2) a subsequent macrocell (e.g., any one of macrocells 104–118), or (3) the output terminal of the macrocell (e.g., output terminal 123). Because product terms PT0–PT4 are routed to previous macrocells or subsequent macrocells, product terms PT0–PT4 are routed in one of two directions along the chain (or ring) formed by macrocells 101–118.

Figure 8:
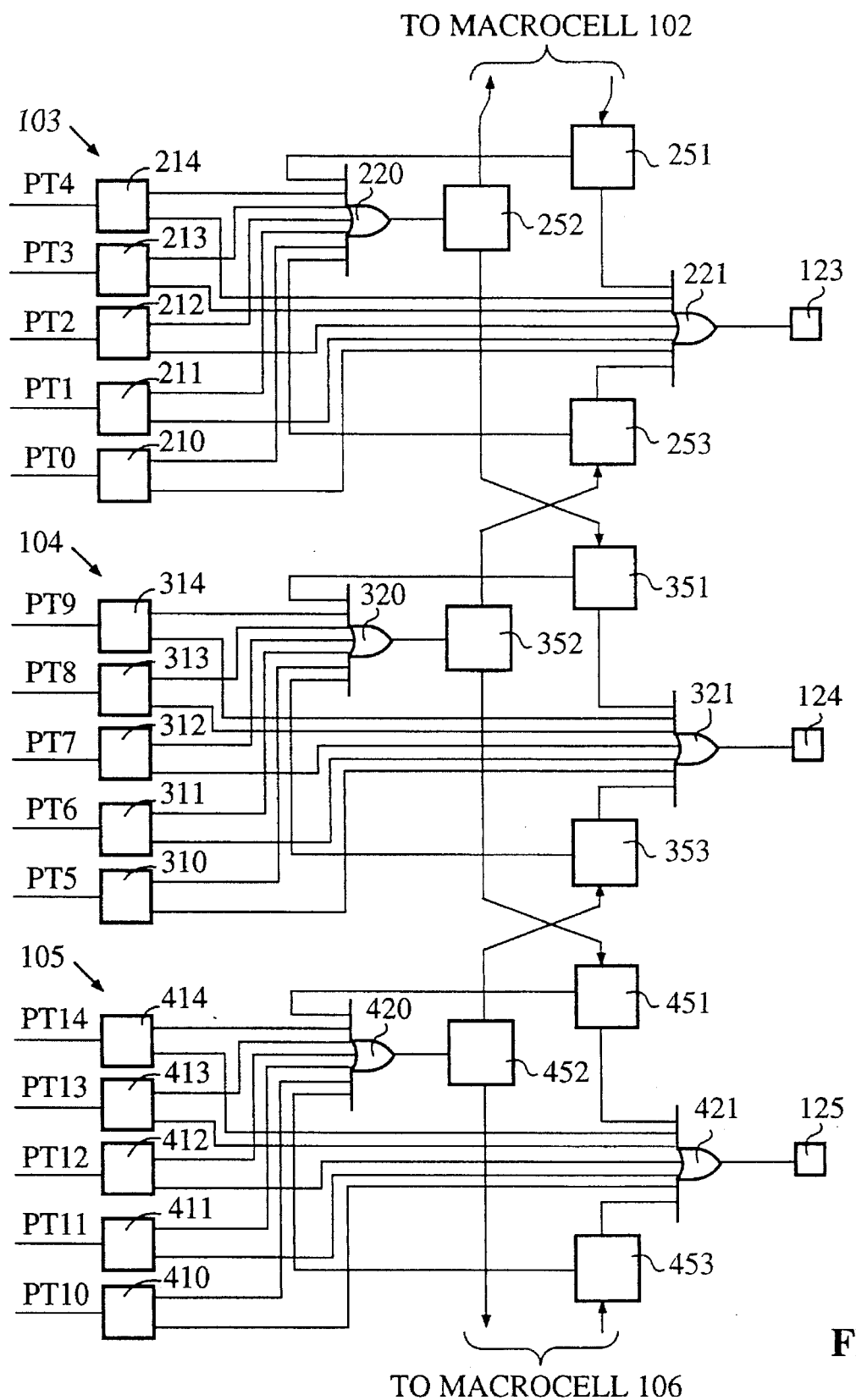
FIG. 8 is a block diagram which illustrates routing of product terms between a plurality of macrocells in accordance with one embodiment of the invention.

The configuration of macrocells 101–118 allows product terms to be routed through a plurality of macrocells to a destination macrocell. FIG. 8 is a block diagram which illustrates routing of product terms between macrocells 103, 104 and 105. Macrocells 104 and 105 each include circuitry which is substantially identical to the circuitry previously described in connection with macrocell 103. Thus, macrocell 104 includes product term distribution circuits 310–314, 7-input OR gates 320–321 and cascade control circuits 351–353, and macrocell 105 includes product term distribution circuits 410–414, 7-input OR gates 420–421, and cascade control circuits 451–453. Macrocell 104 receives product terms PT5–PT9 and macrocell 105 receives product terms PT10–PT14.

Any number of the product terms PT5–PT9 of macrocell 104 are routed to macrocell 103. For example, product terms PT8 and PT9 can be routed to macrocell 103 as follows.

(1) Product term distribution circuits 313 and 314 are programmed to transmit product terms PT8–PT9 to export OR gate 320 of macrocell 104.

(2) Cascade control circuit 352 is programmed to route product terms PT8–PT9 to cascade control circuit 253 of macrocell 103.

(3) Cascade control circuit 253 is programmed to route product terms PT8–PT9 to local OR gate 221 of macrocell 103.

Macrocell 103 selectively receives product terms from more remotely located subsequent macrocells, such as macrocell 105. For example, product terms PT10–PT13 of macrocell 105 are provided to macrocell 103 as follows.

(1) Product term distribution circuits 410–413 are programmed to transmit product terms PT10–PT13 to export OR gate 420 of macrocell 105.

(2) Cascade control circuit 452 is programmed to route product terms PT10–PT13 to cascade control circuit 353 of macrocell 104.

(3) Cascade control circuit 353 is programmed to route product terms PT10–PT13 to export OR gate 320 of macrocell 104.

(4) Cascade control circuit 352 is programmed to route product terms PT10–PT13 to cascade control circuit 253 of macrocell 103.

(5) Cascade control circuit 253 is programmed to route product terms PT10–PT13 to local OR gate 221 of macrocell 103.

Product terms from more than one subsequent (or previous) macrocell are selectively provided to a destination macrocell. For example, product terms PT8–PT9 from macrocell 104 and product terms PT10–PT13 from macrocell 105 are simultaneously provided to macrocell 103 by following all of the programming steps listed above.

Macrocells in accordance with the present invention also have the capability to export product terms at the same time that product terms are being received from another macrocell. For example, in one embodiment, macrocell 104 (FIG. 8) provides product terms PT6–PT9 to macrocell 103, uses product term PT5 locally, and receives product terms PT10–PT14 from macrocell 105 as follows.

(1) Product term distribution circuits 311–314 are programmed to transmit product terms PT6–PT9 to export OR gate 320 of macrocell 104.

(2) Cascade control circuit 352 is programmed to route product terms PT6–PT9 to cascade control circuit 253 of macrocell 103.

(3) Cascade control circuit 253 is programmed to route product terms PT6–PT9 to local OR gate 221 of macrocell 103.

(4) Cascade control circuit 310 is programmed to route product term PT5 to local OR gate 321 of macrocell 104.

(5) Cascade control circuits 410–414 are programmed to route product terms PT10–PT14 to export OR gate 420 of macrocell 105.

(6) Cascade control circuit 452 is programmed to route product terms PT10–PT14 to cascade control circuit 353 of macrocell 104.

(7) Cascade control circuit 353 is programmed to route product terms PT10–PT14 to local OR gate 321 of macrocell 104.

Although the previous examples describe the transmittal of product terms from subsequent macrocells to previous macrocells, product terms can also be transmitted from previous macrocells to subsequent macrocells by reprogramming the elements of these macrocells. Moreover, even though the previous examples only describe the transmittal of product terms using three macrocells, it is understood that in other examples, product terms are transmitted through additional macrocells. In one such example, the product terms of macrocell 118 (FIG. 4) are transmitted to macrocell 103 following the same principles previously described.

The above described capabilities of macrocells 101–118 allow flexible product term reallocation, thereby eliminating the requirement of changing a committed pin out when design changes necessitate changes in the number of product terms routed to some output pins.

Although the invention has been described in connection with several embodiments, it is understood that this invention is not limited to the embodiments disclosed, but is capable of various modifications which would be apparent to one of ordinary skill in the art. For example, although the invention has been described in terms or particular types of logic gates (e.g., AND gates and OR gates), different types and arrangements of gates can easily be substituted for those described to perform the same function. Thus, the invention is limited only by the following claims.

We claim:

1. A first macrocell which connects between logic forming circuitry of a programmable logic device and an output terminal of the programmable logic device, the first macrocell comprising:

one or more input lines which are connected to receive a corresponding number of logic signals from the logic forming circuitry;

one or more distribution circuits, each distribution circuit coupled to one of the input lines, wherein each distribution circuit is independently programmable to a first state or a second state, wherein a distribution circuit programmed in the first state routes received logic signals to the output terminal of the programmable logic device, and wherein a distribution circuit programmed in the second state routes received logic signals to a second macrocell of the programmable logic device; and a cascade control circuit having an input terminal coupled to a third macrocell, the cascade control circuit being programmable to a first state in which the output signals from the third macrocell are routed to the output terminal of the programmable logic device or a second state in which the output signals from the third macrocell are routed to the second macrocell.

2. The macrocell of claim 1, wherein the logic forming circuitry comprises a memory array.

3. The macrocell of claim 2, wherein the memory array comprises an array of AND Gates.

4. The macrocell of claim 2, wherein the memory array comprises a look up table.

5. The macrocell of claim 1, wherein the input lines are product term lines and the logic signals are product terms.

6. The macrocell of claim 1 wherein each distribution circuit comprises:

a programmable latch having an output terminal;

a first logic gate having a first input terminal connected to the output terminal of the programmable latch, a second input terminal connected to one input line; and a second logic gate having a first input terminal connected to the programmable latch through an inverter and a second input terminal connected to another input line.

7. The macrocell of claim 6, wherein the first logic gate has an output terminal coupled to the output terminal of the programmable logic device and the second logic gate has an output terminal coupled to the second macrocell.

8. The macrocell of claim 6, wherein the first and second logic gates are AND gates.

9. The macrocell of claim 1, further comprising a logic gate having input terminals coupled to the one or more distribution circuits and an output terminal coupled to the cascade control circuit.

10. The macrocell of claim 9, wherein the logic gate is an OR gate.

11. The macrocell of claim 1, wherein the cascade control circuit comprises:

a programmable latch having an output terminal;

a first multiplexer having a control terminal coupled to the output terminal of the programmable latch, a first input terminal coupled to the distribution circuits, a second input terminal coupled to a reference voltage, and an output terminal coupled to the second macrocell; and a second multiplexer having a control terminal coupled to the output terminal of the programmable latch, a first input terminal coupled to the reference voltage, a second input terminal coupled to the distribution circuits, and an output terminal coupled to the third macrocell.

12. The macrocell of claim 1, further comprising a cascade control circuit having an input terminal connected to a third macrocell, whereby the cascade control circuit can receive logic signals from the third macrocell, the cascade control circuit being programmable to a first state, wherein in the first state the cascade control circuit routes the received logic signals to the output terminal of the programmable logic device.

13. A first macrocell which connects between logic forming circuitry of a programmable logic device and an output terminal of the programmable logic device, the first macrocell comprising:

one or more input lines coupled to receive a corresponding number of logic signals from the logic forming circuitry;

one or more distribution circuits each distribution circuit coupled to one of the input lines, wherein each distribution circuit is independently programmable to a first state or a second state, wherein a distribution circuit programmed in the first state routes received logic signals to the output terminal of the programmable logic device, and wherein a distribution circuit programmed in the second state routes received logic signals to a second macrocell of the programmable logic device;

a first logic gate connected between each of the distribution circuits and the output terminal of the programmable logic device; and a second logic gate connected between each of the distribution circuits and the second macrocell.

14. The macrocell of claim 13, wherein the first and second logic gates are OR gates.

15. A first macrocell which connects between logic forming circuitry of a programmable logic device and an output terminal of the programmable logic device, the first macrocell comprising:

an export logic gate;

a first cascade control circuit connected to receive logic signals from a second macrocell, wherein the first cascade control circuit is programmable to route logic signals received from the second macrocell to the export logic gate;

a second cascade control circuit connected to an output terminal of the export logic gate, wherein the second cascade control circuit is programmable to route logic signals received by the export logic gate to a third macrocell; and a third cascade control circuit connected to receive logic signals from the third macrocell, wherein the third cascade control circuit is programmable to route logic signals received from the third macrocell to either the export logic gate or the output terminal of the programmable logic device.

16. The macrocell of claim 15, wherein the first cascade control circuit is further programmable to route the logic signals received from the second macrocell to the output terminal of the programmable logic device.

17. The macrocell of claim 16, further comprising a local logic gate coupled between the first cascade control circuit and the output terminal of the programmable logic device.

18. The macrocell of claim 17, wherein the export logic gate and the local logic gate each comprise an OR gate.

19. The macrocell of claim 17, further comprising:

one or more input lines which are connected to receive a corresponding number of logic signals from the logic forming circuitry;

one or more programmable distribution circuits, each distribution circuit connected to one of the input lines, wherein each distribution circuit is independently programmable to route a received logic signal to either the export logic gate or the local logic gate.

20. The macrocell of claim 15, further comprising a local logic gate coupled between the first and third cascade control circuits and the output terminal of the programmable logic device.

21. The macrocell of claim 20, wherein the local logic gate and the export logic gate each comprise an OR gate.

22. A macrocell which connects between logic forming circuitry of a programmable logic device and an output terminal of the programmable logic device, the macrocell comprising:

one or more input lines which receive a corresponding one or more logic signals;

a local logic gate;

an export logic gate;

one or more distribution circuits, each distribution circuit connected to a corresponding one of the input lines, wherein each distribution circuit is independently programmable to route a corresponding logic signal to either the local logic gate or the export logic gate;

a first cascade control circuit connected to an output terminal of the export logic gate, wherein the first cascade control circuit is programmable to route logic signals received by the export logic gate to either a second macrocell or a third macrocell;

a second cascade control circuit connected to receive logic signals from the second macrocell, wherein the second cascade control circuit is programmable to route logic signals received from the second macrocell to either the export logic gate or the local logic gate; and a third cascade control circuit connected to receive logic signals from the third macrocell, wherein the third cascade control circuit is programmable to route logic signals received from the third macrocell to either the export logic gate or the local logic gate.

23. A method of routing logic signals from logic forming circuitry of a programmable logic device to output terminals of the programmable logic device, the method comprising the steps of:

providing a plurality of first logic signals to a first macrocell of the programmable logic device;

selecting first and second groups of the first logic signals, wherein the number of first logic signals in the first and second groups can be varied;

transmitting the first group of the first logic signals to an output terminal corresponding to the first macrocell;

transmitting the second group of the first logic signals to a second macrocell of the programmable logic device;

providing a plurality of second logic signals from a third macrocell to the first macrocell; and selectively transmitting the second logic signals to the output terminal of the first macrocell or to the second macrocell, wherein the first group of the fist logic signals includes any number from zero to all of the first logic signals.

24. The method of claim 23, wherein the second macrocell is located adjacent to the first macrocell.

25. The method of claim 23 further comprising the step of transmitting a third group of logic signals from the second macrocell to the output terminal corresponding to the first macrocell, wherein the third group includes one or more logic signals provided to the second macrocell.

26. A method of routing logic signals from logic forming circuitry of a programmable logic device to output terminals of the programmable logic device, the method comprising the steps of:

providing a plurality of logic signals to a first macrocell of the programmable logic device;

selecting first and second groups of the logic signals, wherein the number of logic signals in the first end second groups can be varied;

transmitting the first group to an output terminal corresponding to the first macrocell; and transmitting the second group to a second macrocell of the programmable logic device through one or more intermediate macrocells of the programmable logic device.

27. The method of claim 26, wherein the step of transmitting the second group further comprises the step of selecting a direction of transmission.

28. The method of claim 26, further comprising the steps of transmitting a third group of logic signals from a third macrocell to the second macrocell and performing one or more logic functions on said second and third groups.

29. A method of routing logic signals from logic forming circuitry of a programmable logic device to output terminals of the programmable logic device, the method comprising the steps of:

providing a first plurality of logic signals to a first macrocell of the programmable logic device;

transmitting a second plurality of logic signals from a second macrocell of the programmable logic device to the first macrocell;

routing the second plurality of logic signals through the first macrocell; and transmitting the second plurality of logic signals from the first macrocell to a third macrocell, wherein any number of logic signals of the first plurality of logic signals can be transmitted to the output terminal of the first macrocell and any remaining signals of the first plurality of logic signals are transmitted to the third macrocell.

30. The method of claim 29, wherein the step of transmitting the second group further comprises the step of selecting the second macrocell from either a previous macrocell or a subsequent macrocell.

* * * * *

UNITED STATES PATENT AND TRADEMARK OFFICE
CERTIFICATE OF CORRECTION

PATENT NO. : 5,563,529

DATED : October 8, 1996

INVENTOR(S) : Jeffrey H. Seltzer, Jesse H. Jenkins, IV and Sholeh Diba

It is certified that error appears in the above-identified patent and that said Letters Patent is hereby corrected as shown below:

Col. 13, line 29, "fist" should read --first--.

Col. 14, line 4, "end" should read --and--.

Signed and Sealed this

Twenty-third Day of December, 1997

Attest:

Attesting Officer

BRUCE LEHMAN

Commissioner of Patents and Trademarks